United States Patent [19]

Schaible et al.

[11] 4,181,841
[45] Jan. 1, 1980

[54] SIGNAL DISTRIBUTION CIRCUIT INCLUDING LOAD REGULATOR

[75] Inventors: Wolfgang Schaible, Würenlingen; Hanspeter Senn, Fislisbach, both of Switzerland

[73] Assignee: BBC Brown Boveri & Company Limited, Baden, Switzerland

[21] Appl. No.: 804,059

[22] Filed: Jun. 6, 1977

[30] Foreign Application Priority Data

Jun. 14, 1976 [CH] Switzerland ................. 7502/76

[51] Int. Cl.$^2$ ............................................. H02J 4/00
[52] U.S. Cl. ........................................ 307/30; 323/4; 323/25; 307/31
[58] Field of Search .................. 307/30, 31, 33, 39, 307/42, 11; 323/1, 4, 22 T, 25, 22 Z

[56] References Cited

U.S. PATENT DOCUMENTS

| | | | |
|---|---|---|---|
| 3,564,444 | 2/1971 | Walsh | 323/4 |
| 3,911,354 | 10/1975 | Stanton | 323/4 |
| 3,952,241 | 4/1976 | Takemura | 323/19 |

OTHER PUBLICATIONS

"Op Amp Stabilizes Zener Diode in Reference-Voltage Source", Miller & DeFreitas, Electronics, Feb. 20, 1975, p. 101.

Primary Examiner—John Gonzales
Assistant Examiner—S. D. Schreyer
Attorney, Agent, or Firm—Werner W. Kleeman

[57] ABSTRACT

A circuit arrangement for the distribution of electrical signals, comprising a signal input and a multiplicity of signal outputs and at least one decoupling circuit preventing a reactive effect between the signal outputs. For each signal output there is provided a controllable current source containing a resistor of predetermined size which is arranged in the output circuit of such current source as well as a null voltage indicator having two inputs and a control output connected with the associated controllable current source. The voltage drop at each of the resistors is connected by means of one of the inputs of the associated null voltage indicator in opposition with the signal input.

5 Claims, 2 Drawing Figures

SIGNAL DISTRIBUTION CIRCUIT INCLUDING LOAD REGULATOR

BACKGROUND OF THE INVENTION

The present invention relates to a new and improved construction of a circuit arrangement for the distribution of i.e., a signal distribution circuit including a load current regulator, which is of the type comprising a signal input and a multiplicity of signal outputs and at least one decoupling circuit which prevents any reactive effect between the signal outputs.

Such type distribution circuits are generally constructed as a star- or multiple parallel-circuits containing decoupling diodes or amplifiers at the individual outputs, when such is concerned with the distribution of an input signal voltage, or as multiple series-circuitry containing output terminal pairs having a corresponding number of voltage limiters, for instance Zener diodes, each bridging an output terminal pair, when such is concerned with the distribution of an input signal current (impressed current). In the last-mentioned situation the current in the output circuits connected in series with one another to a certain extent is independent of the maximum value of the impedance contained in such circuits, whereas upon exceeding the corresponding maximum voltage at each output the related limiter is effective and prevents any reactive effect upon the other outputs in the form of a current reduction.

In order to have distribution of the signal voltages and signal currents free of any reactive effect there are valid in each case dual requirements, so that in the discussion hereinafter it will be sufficient to consider in detail the signal current distribution, without eliminating from the subject matter of the invention the corresponding signal voltage distribution which also will be apparent from such discussion.

At the signal divider of the type here under discussion there are generally placed the following requirements:

(1) Interruption, such as short-circuits in a signal output circuit, should not have any influence upon the other signal outputs.

(2) Ground or mass connections in a signal output circuit should not have any influence upon another signal output circuit, which, in turn, has an operational ground connection.

(3) A connection with a supply voltage or other external voltage is a signal output circuit should not result in destruction of non-participating signal output circuits or receivers contained therein, respectively.

The requirements mentioned under item (1) above are generally fulfilled with conventional signal current distributors containing series circuit of the signal output circuit and bridging by voltage limiters, not however the requirements listed under paragraphs (2) and (3). The latter would be possible with the aid of buffer or bridging amplifiers, which however lead to an undesired increase of the equipment expenditure and moreover, in turn, result in reduced operational reliability due to their possible failure in operation.

SUMMARY OF THE INVENTION

Hence, it is a primary object of the present invention to provide a new and improved construction of a signal distribution circuit which is not associated with the aforementioned drawbacks and limitations of the prior art proposals.

Another and more specific object of the present invention aims at the provision of a new and improved construction of a signal distribution circuit which, with comparatively low equipment expenditure, enables fulfilling the requirements mentioned above in paragraphs (1), (2), (3).

Still a further significant object of this invention aims at a novel construction of signal distributor circuitry which is relatively simple in construction and design, extremely reliable in operation, not readily subject to malfunction, and capable of effectively carrying out the aforementioned requirements.

Now in order to implement these and still further objects of the invention, which will become more readily apparent as the description proceeds, the present invention contemplates a circuit arrangement for the distribution of electrical signals, comprising a signal input and a multiplicity of signals outputs and at least one decoupling circuit capable of preventing reactive effects between the signal outputs. For each signal output there is provided a controllable current source having a resistor of a predetermined size or magnitude arranged in the output circuit of such current source as well as a null voltage indicator having two inputs and a control output connected with the associated or related controllable current source. Further, the voltage drop at each of the resistors is connected by means of one of the inputs of the associated null voltage indicator in opposition with the signal input.

The controllable current sources provided herein for the signal outputs can be realized with low equipment expenditure by means of simple valves, for instance a respective transistor, connected to a common or also separate voltage sources. Furthermore, no great demands are placed upon the accuracy and constancy of the amplification or gain and other transmission characteristics. Also the null voltage indicators constitute extremely simple circuit elements, because what is here important, apart from maintaining low the offset-voltages which can be easily accomplished, is only that there is an adequately great amplification which is otherwise uncritical as to the magnitude thereof. Additionally, in contrast to buffer amplifiers in the signal transmission circuit, here one is concerned with a gain which is low in power loss. The expenditure in circuit hardware needed for the solution of the objectives of the invention is, as required, comparatively low, yet not only renders possible the fulfillment of the requisite interruption- and short-circuit non-sensitivity, but also the ground connection- and external voltage non-sensitivity, because the signal output circuits are decoupled from one another by the controllable current sources.

According to a further aspect of the invention for a multiplicity of signal outputs there is provided a common maximum boundary-potential source and/or a common minimum boundary-potential source and in each instance one terminal of one of each signal output is connected by means of a rectifier device with at least one boundary-potential source. In this way it is possible to limit to a permissible degree potential- and voltage changes at the individual signal outputs in the event of interruptions or application of external voltages, and specifically, by means of a single common boundary voltage source for each boundary direction. By means of the decoupling of the different outputs it is thus also possible to prevent any major disturbance in each individual output circuit.

An advantageous constructional embodiment of the invention contemplates that the signal input is provided with a source working with an impressed current signal and an input resistor of predetermined magnitude arranged in such signal current circuit and that the voltage drop at this input resistor is connected in opposition with given inputs of a multiplicity of null voltage indicators. This circuit arrangement additionally brings about a decoupling between the input- and output-circuits, and furthermore, allows for an exactly defined magnitude transformation of the signal to be distributed by merely appropriately dimensioning the input resistor.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
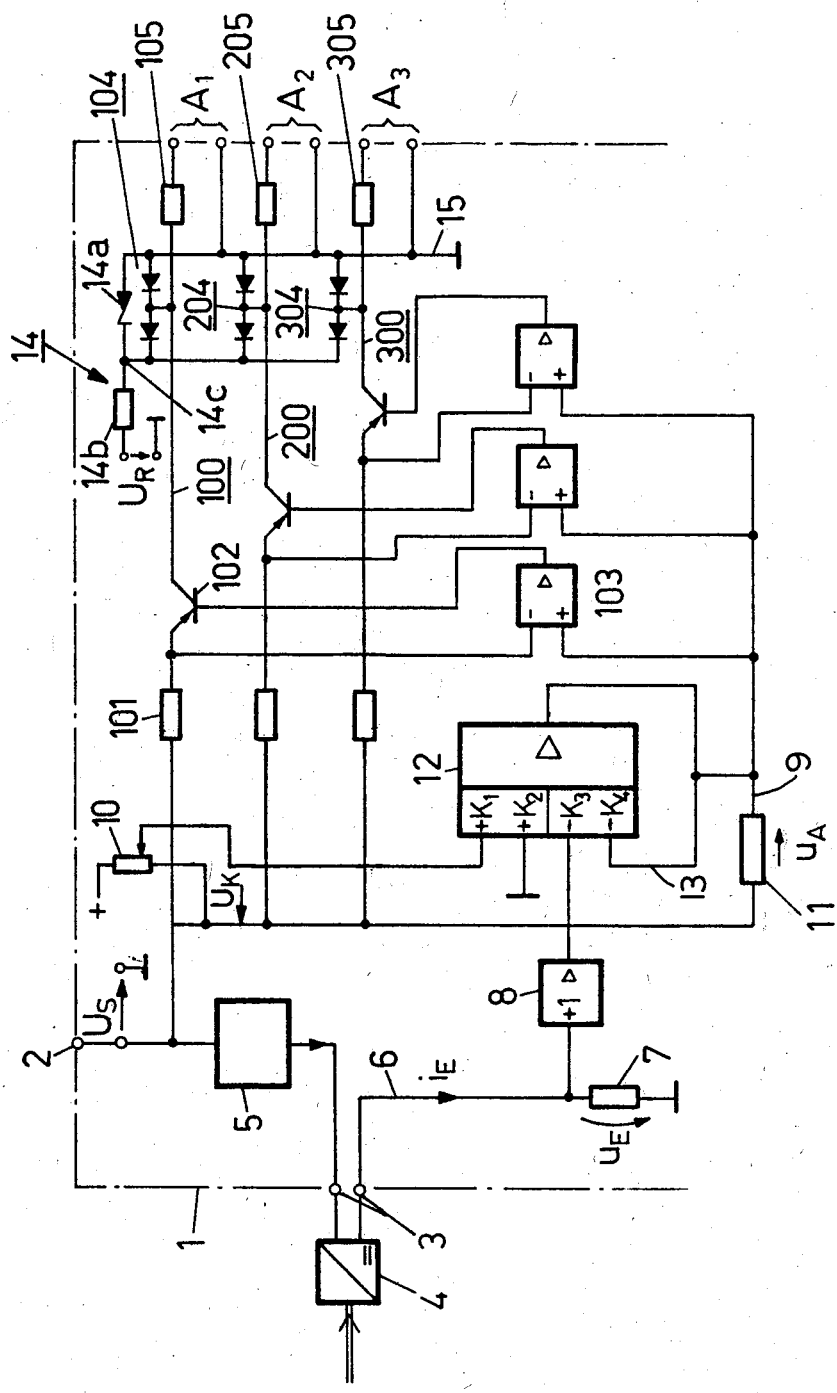
FIG. 1 is a principle circuit diagram of a signal distribution circuit constructed according to the present invention wherein at the input side there is accomplished signal current-voltage conversion.

The distribution or distributor circuit 1 shown by way of example in FIG. 1 will be seen to comprise, apart from a direct-current supply terminal or connection 2 with the supply voltage $U_S$ at a given supply potential $U_S$ in relation to ground, a signal input terminal pair 3 with which there is connected a measurement value converter 4, typically a standard transducer. This measurement value converter 4 delivers the signal which is to be distributed and is designed as a so-called two-wire converter having identical supply and output circuitry, i.e. the output circuit is in series with the supply potential $U_S$. The supply- and output circuitry of the measurement value transformer 4 is connected by means of a circuit 5 containing a filter, fuses, possibly potential isolating link and similar auxiliary elements, with the supply of the distribution circuit 1 and corresponds to a first input circuit 6 of the distribution circuit where there thus flows the impressed current $i_E$ in the form of an analog input signal. In this first input circuit 6 there is arranged an input resistor or resistance 7 of predetermined magnitude producing a voltage drop $u_E$ which is proportional to the input signal, and which is applied to a second input circuit 9 of the distribution circuit 1 in the form of an input signal voltage by means of a buffer or bridging amplifier 8, which transmits in a ratio of +1, and a compensation amplifier 12. The buffer or bridging amplifier 8 especially can be designed as a potential isolating-signal transmitter, if—in conjunction with a potential isolation of the already mentioned type as provided in the circuitry 5—there is desired a galvanic decoupling between the measurement converter and the distributor or distribution circuit.

The second input circuit 9 of the distribution circuit encompasses, apart from a correction voltage source 10 which can be adjusted by means of a potentiometer and a second input resistor 11, the compensation amplifier 12 which possesses at least two oppositely functioning inputs, i.e., inputs which form a difference and a negative feedback circuit 13. The second input resistor 11 is connected in the circuit between the amplifier output and the supply source, so that the latter also acts upon the feedback circuit 13, whereas the input signal voltage $u_E$ is connected in circuit with another input of the amplifier 12, as shown. A respective further input is connected via the correction voltage $U_K$ of the source 10 with the supply voltage and ground, respectively. By means of a still further to be described circuitry (FIG. 2) containing input resistors, which in FIG. 1 are incorporated in the amplifier 12, each amplifier input receives one of the infed weighting factors $+K_1$, $+K_2$, $-K_3$, $-K_4$. As also will be discussed more fully hereinafter, the amplifier produces in this manner at the second input resistor 11 (such could also be considered as the output resistor of the amplifier) a current of such magnitude and direction, that the corresponding voltage drop $u_A$ of the input signal voltage $u_E$ can be expressed by the following equation:

$$u_A = K \cdot (u_E + K_K \cdot U_K). \qquad \text{Equation (1)}$$

In the above equation the symbols $K$ and $K_K$ merely represent factors dependent upon the circuit resistances, whereas $U_K$ constitutes the already mentioned adjustable correction voltage which can be freely selected also according to its polarity.

Thus, the compensation amplifier 12 at the output side containing the impressed voltage corresponding to the input signal voltage—possibly additively (positive or negative) superimposed with a correction voltage factor—can be considered as the controlled source working upon the second input resistor, and which in the form of the mentioned voltage drop $u_A$ delivers a further voltage signal correlated to the input signal voltage $u_E$ according to the above Equation (1), but independent of the supply voltage $U_S$. This signal voltage $u_A$, which is multiplicatively and additively modified according to the momentary technical transmission requirements, moreover is fixed at one side at the potential of the supply terminal or connection 2 and for this reason can freely follow the independency of the supply voltage, and thus, even without any potential isolation is independent in this regard from the potential conditions in the first input circuit and in the measuring or measurement circuit.

The input resistor 11 with the signal voltage $u_A$ constitutes a control element for a multiplicity of output signal circuits 100, 200, 300 with corresponding output terminal pairs $A_1$, $A_2$, $A_3$. The number of these outputs is practically unlimited. The construction and operation of the different output circuits is the same, so that it will be sufficient for purposes of this disclosure to merely consider in detail the output circuit 100.

In the output circuit 100 there is arranged an exactly dimensioned compensation resistor 101 in series with a controllable current source, including a valve 102. This controllable current source embodies the common supply voltage $U_S$ which is infed to all of the output circuits at the terminal 2. The valve 102 constitutes an adjustment or control element. The signal voltage $u_A$ for each output circuit is connected by means of its own null voltage indicator—in the case of the output or load circuit 100 by means of the null voltage indicator 103—opposite the voltage drop at the associated compensation resistor. Useful as the null voltage indicators, are, in this case, simple differential amplifiers (operational amplifiers) having inverting and non-inverting inputs. The output of one of each such null voltae indicator is controllably connected with the associated voltage source i.e. with the control input of the relevant valve. Consequently, the current in the output circuit is regulated to such a magnitude that the voltage drop at the compensation resistor corresponds exactly to the signal voltage $u_A$, in other words also the output signal current. A reactive effect from one output to the other is thus eliminated by the valves of the controllable current sources and by the null voltage indicators serving as decoupling elements i.e. inhibiting interaction between each of the output or load circuits 100, 200, 300 etc. and the input circuit 9. The input signal which is possibly additively and multiplicatively corrected is thus distributed in the required manner to the outputs. The valve 102, the resistor 101 and the null voltage indicator 103 constitute a decoupling circuit for its related output or load circuit 100. This is analogously true for the corresponding elements of the related load circuits 200 and 300.

The previously mentioned correction of the input signal in particular renders possible the often required elimination of a null component in the input signal, so that the variation range of this signal, related to a basic measurement magnitude change of 100%, extends from a finite minimum value, approximately 5%, to 100%. Therefore, the correction must reside in the fact that from the actual input signal there is substracted the finite minimum value and the result multiplied with a fixed factor which takes into account different but equal-value variation ranges, here for instance 1/0.95. As will be apparent this correction can be readily accomplished with appropriately determined factors according to the aforementioned Equation (1) in the circuit under discussion.

Additionally, there is also provided a voltage limiting of the outputs, and specifically, with a common maximum-boundary potential source 14, which encompasses a direct-current reference voltage $U_R$ having connected therewith a Zener diode 14a and a dropping resistor 14b. This maximum-boundary potential source is connected, in the embodiment under discussion, with the mass or ground terminal or connection 15, which here corresponds to a minimum-boundary potential source and could equally possess a finite potential below the potential of the circuit point or junction 14c. Between the circuit points 14c and 15 there are connected in parallel a number of diode-series circuits 104, 204, 304, corresponding to the number of outputs, and the center point or junction of which in each instance is connected with an associated output terminal. Thus, when the potential of the output terminal exceeds that of the point 14c or falls below that of the circuit point or junction 15, then the relevant diode becomes conductive and fixes the output terminal potential. A corresponding circuit also could be provided for the other output terminals and for the other terminals of all outputs, so that there would be realized a complete output potential- and output voltage-limiting action.

The resistors 105, 205 and 305 which are arranged in the output circuits limit the current due to external voltages. Each resistor is dimensioned such that there is continuously permissible an unintentional connection of the output terminal with the supply source and there cannot occur any damage to the circuit. An unintentional connection at higher voltage (network, battery) however destroys the resistor which is appropriately designed as concerns its thermal load limit and separates the remaining circuit from the high voltage. The resistor therefore also assumes the function of a fuse, but is however mechanically and electrically non-sensitive to disturbing influences and therefore has a greater availability than the fuse.

Figure 2:
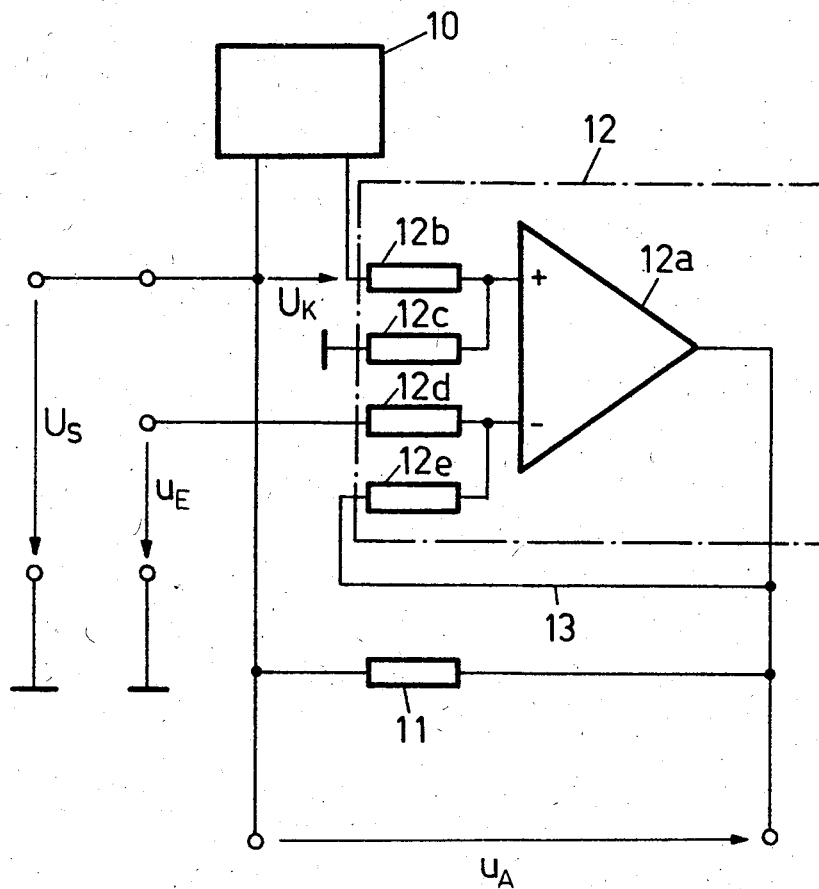
FIG. 2 illustrates an exemplary embodiment of a compensation amplifier used at the distribution input for the signal current-voltage conversion.

Finally, in FIG. 2 there is shown the internal structure of the compensation amplifier 12 embodying the operational amplifier 12a and the input resistors 12b to 12e. As tests have shown the factor K, as concerns its magnitude and sign, can be adjusted by suitably dimensioning the resistance values, and specifically between magnitudes of null and infinity. Moreover, the factor $K_K$ for influencing the additive correction element is determined by the relationship of the resistance values of the resistors 12b and 12c.

While there are shown and described present preferred embodiments of the invention, it is to be distinctly understood that the invention is not limited thereto, but may be otherwise variously embodied and practiced within the scope of the following claims. Accordingly,

What we claim is:

1. A circuit arrangement for the distribution of electrical signals, comprising:
    means providing a signal input;
    means providing a multiplicity of signal outputs;
    at least one decoupling circuit for preventing reactive effects between the signal outputs;
    said decoupling circuit comprising:
        a respective controllable current source including a supply source and having an output circuit provided for each signal output;
        a respective resistor of predetermined magnitude arranged in the output circuit of an associated one of the controllable current sources;
        a respective null voltage indicator having two inputs and a control output connected with an associated one of the controllable current sources;
    one of the two inputs of the null voltage indicator being connected with said signal input means;
    the other of said two inputs of the null voltage indicator being connected with the related respective resistor;
    the voltage drop across each of the resistors being connected through said other input of the associated null voltage indicator in opposition with the signal input supplied to said one input of the associated null voltage indicator;
    a common maximum boundary-potential source provided for said multiplicity of signal outputs; and
    rectifier means for connecting one terminal of each signal output with said common maximum boundary-potential source.

2. A circuit arrangement for the distribution of electrical signals, comprising:
    means providing a signal input;
    means providing a multiplicity of signal outputs;
    at least one decoupling circuit for preventing reactive effects between the signal outputs;
    said decoupling circuit comprising:
        a respective controllable current source including a supply source and having an output circuit provided for each signal output;

a respective resistor of predetermined magnitude arranged in the output circuit of an associated one of the controllable current sources;

a respective null voltage indicator having two inputs and a control output connected with an associated one of the controllable current sources;

one of the two inputs of the null voltage indicator being connected with said signal input means;

the other of said two inputs of the null voltage indicator being connected with the related respective resistor;

the voltage drop across each of the resistors being connected through said other input of the associated null voltage indicator in opposition with the signal input supplied to said one input of the associated null voltage indicator;

a common minimum boundary-potential source; and rectifier means for connecting one terminal of each signal output with said common minimum boundary-potential source.

3. A circuit arrangement for the distribution of electrical signals, comprising:

means providing a signal input;

means providing a multiplicity of signal outputs;

at least one decoupling circuit for preventing reactive effects between the signal outputs;

said decoupling circuit comprising:

a respective controllable current source including a supply source and having an output circuit provided for each signal output;

a respective resistor of predetermined magnitude arranged in the output circuit of an associated one of the controllable current sources;

a respective null voltage indicator having two inputs and a control output connected with an associated one of the controllable current sources;

one of the two inputs of the null voltage indicator being connected with said signal input means;

the other of said two inputs of the null voltage indicator being connected with the related respective resistor;

the voltage drop across each of the resistors being connected through said other input of the associated null voltage indicator in opposition with the signal input supplied to said one input of the associated null voltage indicator;

a common maximum boundary-potential source and a common minimum boundary-potential source for said plurality of signal outputs, and rectifier means for connecting one terminal of each signal output with at least one such boundary-potential source.

4. A circuit arrangement for the distribution of electrical signals, comprising:

means providing a signal input;

means providing a multiplicity of signal outputs;

at least one decoupling circuit for preventing reactive effects between the signal outputs;

said decoupling circuit comprising:

a respective controllable current source including a supply source and having an output circuit provided for each signal output;

a respective resistor of predetermined magnitude arranged in the output circuit of an associated one of the controllable current sources;

a respective null voltage indicator having two inputs and a control output connected with an associated one of the controllable current sources;

one of the two inputs of the null voltage indicator being connected with said signal input means;

the other of said two inputs of the null voltage indicator being connected with the related respective resistor;

the voltage drop across each of the resistors being connected through said other input of the associated null voltage indicator in opposition with the signal input supplied to said one input of the associated null voltage indicator;

said signal input means including a signal input circuit and comprising a source operating with impressed signal and an input resistor of predetermined magnitude arranged in said signal input circuit;

the voltage drop at such input resistor being connected with said one related input of each of said multiplicity of null voltage indicators;

said source of the signal input and operating with the impressed signal being constructed as a compensation amplifier;

said compensation amplifier being structured as a differential amplifier having oppositely operating inputs constituting inverting input means and non-inverting input means and an amplifier output;

a respective associated voltage divider having an output;

said oppositely operating inputs being connected in circuit with the output of the associated voltage divider;

an input voltage means;

one said voltage divider associated with the inverting input means being connected with the input voltage means and with the amplifier output;

means defining a reference potential;

another one of said voltage dividers associated with the non-inverting input being connected with the reference potential;

an amplifier output resistor connected between said reference potential defining means and the amplifier output;

said amplifier output resistor corresponding to said input resistor.

5. The circuit arrangement as defined in claim 4 further including:

a direct-current voltage means provided for said signal input means;

said reference potential defining means comprises an additive correction voltage source connected in the input circuit of the compensation amplifier in series with the direct-current voltage means.

* * * * *